United States Patent [19]
Chinn

[11] Patent Number: 5,233,549
[45] Date of Patent: Aug. 3, 1993

[54] REDUCED QUANTIZATION ERROR FIR FILTER

[75] Inventor: Garry Chinn, Los Angeles, Calif.

[73] Assignee: Loral Aerospace Corp., New York, N.Y.

[21] Appl. No.: 871,408

[22] Filed: Apr. 21, 1992

[51] Int. Cl.⁵ .............................................. G06F 15/31
[52] U.S. Cl. .............................................. 364/724.16
[58] Field of Search ..................... 364/724.16, 724.01, 364/724.19, 724.17, 724.04, 715.01, 748.05

[56] References Cited

U.S. PATENT DOCUMENTS

| | | | |
|---|---|---|---|
| 4,691,293 | 9/1987 | Conboy | 364/724 |
| 4,782,458 | 11/1988 | Bhattacharya | 364/724.16 |
| 4,805,129 | 2/1989 | David | 364/724.01 |
| 4,809,209 | 2/1989 | White | 364/724.16 |
| 4,811,259 | 3/1989 | Costas | 364/724.16 |
| 5,111,419 | 5/1992 | Morley, Jr. et al. | 364/724.19 |
| 5,170,369 | 12/1992 | Rossum | 364/724.17 |

Primary Examiner—Long T. Nguyen
Attorney, Agent, or Firm—Wayne P. Sobon; Edward J. Radlo; Dennis S. Fernandez

[57] ABSTRACT

Apparatus and methods for reducing the quantization error in shift-matrix finite impulse response (FIR) filters (210) operate on a sampled analog signal (11) converted to a sequence of digital signal samples (13). A weight conversion device (23) converts a weight signal W comprising a sequence of tap weights $W_i$ into both a corresponding series of logarithmically-encoded weights $W'_i$ and a series of weight error values $\Delta W_i$. A multiplication device (30) multiplies each of the digital signal samples (13) with the first series of logarithmically-encoded weights $W'_i$ and provides the results to an accumulator (26). A signal encoding device (40) converts the digital signal samples (13) into a sequence of logarithmically-encoded digital signal samples (42). A quantization error correction device (220) multiplies each of the weight error values $\Delta W_i$ by the logarithmically-encoded digital signal samples (42) and also provides the results simultaneously to the accumulator (26). The accumulator (26) sums all multiplications provided to it and provides the result as the FIR filter output (28). The apparatus and methods provided by the present invention reduce the quantization error found in shift-matrix FIR filters without sacrificing speed and frequency response.

16 Claims, 3 Drawing Sheets

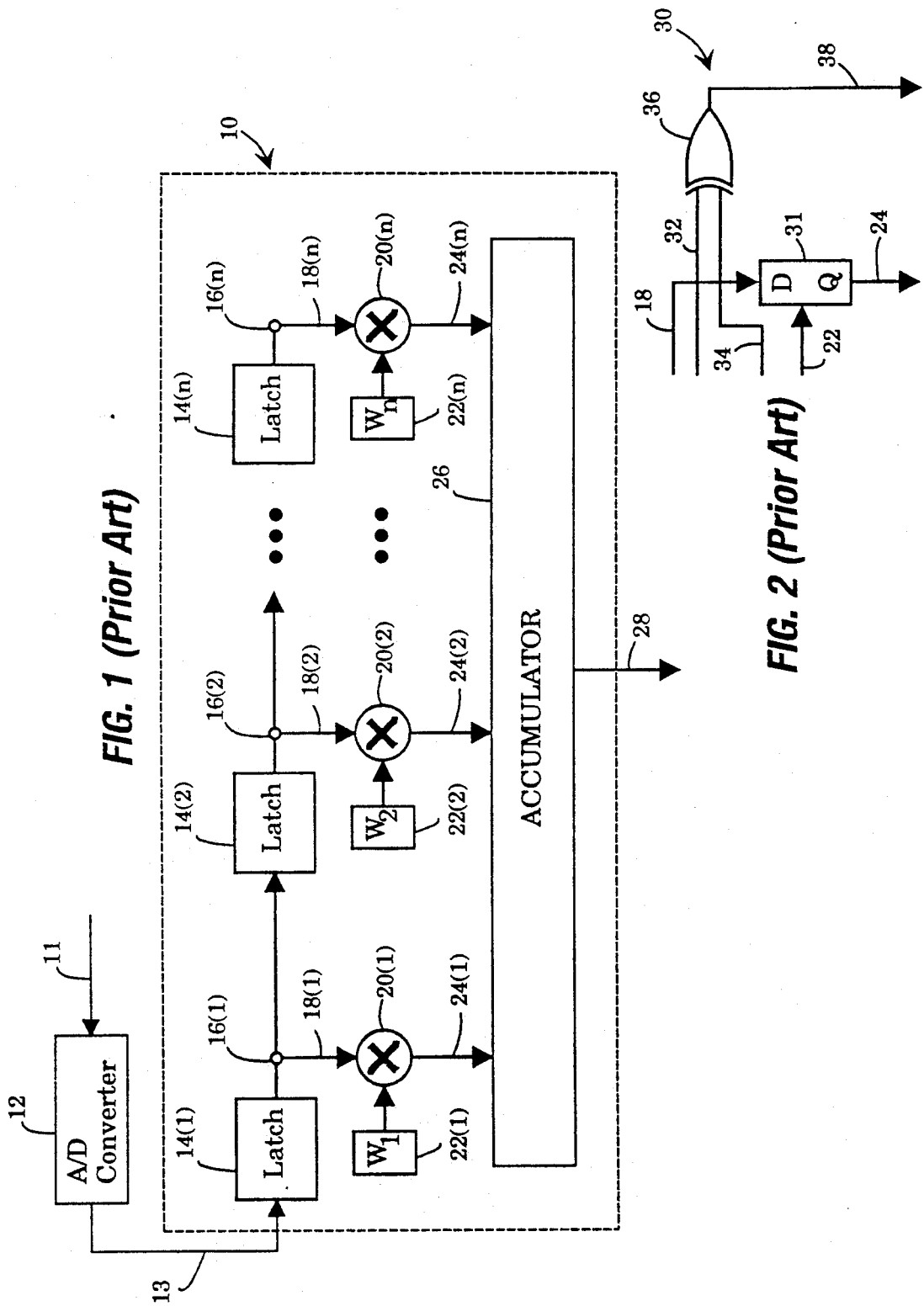

REDUCED QUANTIZATION ERROR FIR FILTER

DESCRIPTION

1. Technical Field

The present invention relates to digital signal processors. In particular the invention relates to finite impulse response (FIR) filters.

2. Background Art

Finite impulse response (FIR) filters are devices for yielding the inner-product equation given by:

$$y = \sum_{i=1}^{n} w_i x_i \qquad \text{EQN. (1)}$$

where y is the FIR filter output, $w_i$ represents the adaptable weight of the ith tap, $x_i$ represents the input signal data at the ith tap, and n is the total number of taps in the filter. Each input tap represents one of a series of successive time samples of the input signal data stream. An FIR filter provides a versatile digital signal processing device since its filtering characteristics can be altered simply by changing the weights applied at each tap. In an adaptive FIR filter, each of the weights ($w_1$, $w_2$, ... $w_n$) can be changed while the filter is operating.

Despite their versatility, the slower operating speeds of FIR filters limit their applications. Very-high-speed digital implementations of the FIR filters given by EQN. 1 are both difficult and expensive to build. These implementations require a relatively large amount of circuitry to form digital multipliers. As a result, previous designs to accelerate the operation of the FIR filter have substituted multipliers with simple shift operations. However, this technique reduces the accuracy of the filtering characteristics of the FIR filters since the weights are rounded to the nearest power of two.

FIG. 1 illustrates the operation of a conventional prior art FIR filter 10. The input signal 11 is sampled periodically at a given data rate and converted to a two's complement representation by an analog-to-digital converter 12. The converted data 13 then travels through a series of delay latches 14(1), 14(2), ... 14(n). "14(i)" will be used throughout the specification to stand for the generic member of the series. A junction 16(i) at the output of each latch 14(i) is called a tap. Each tap 16(i) (except the nth) feeds into both the next latch 14(i+1) of the series of latches, as well as to an input of a multiplier 20(i). As the converted and sampled digital signal data 11 is fed into the series of delay latches 14(i), the taps 16(i) contain a series of consecutive samples 18(i) of the input signal 11. A respective multiplier 20(i) multiplies each of these samples by its corresponding tap weight $w_i$ stored by weight register 22(i). The succession of tap weights $w_i$ can be chosen to obtain some desired filtering characteristic. The multiplication products 24(i) of multipliers 20(1) through 20(n) are then conveyed to an accumulator array 26 that sums these outputs to provide the final output 28 of the FIR filter. After each multiplication and addition step, the digital signal data stored in latch 14(i) is moved to the next latch in sequence 14(i+1) and a new digital signal sample is latched into first latch 14(1).

The operating speed of conventional FIR filters is limited by the speed of the multipliers 20(i). Fully implementing digital multipliers requires a large amount of digital circuitry. Due to massive hardware demands, FIR filters often use a single multiplier circuit to perform the multiplications for a number of taps 16(i) operating in sequence. Unfortunately, time-sharing the multiplication circuit severely restricts the frequency range of the filter.

Binary multiplication can be implemented by a series of shift and add operations. Shifting a binary number one place to the right is equivalent to division by two. Shifting a binary number one place to the left multiplies the number by two. A simpler approach restricts the multiplier to a power of two, with multiplications carried out by a single binary shift operation. However, rounding off the multiplier to a power of two results in unwanted quantization errors. In such an FIR filter, the rounded tap weights would be restricted to $\pm 1$, $\pm 0.5$, $\pm 0.25$, $\pm 0.125$, etc.

To simplify FIR filter design and fabrication, current prior art approaches for designing an FIR filter replace each of the multipliers 20(i) with a shift-matrix circuit 30 as shown in FIG. 2. FIG. 2 is a block diagram of a shift-matrix designed for a two's-complement signed number. A data (signal) input 18 is shifted by shift device 31 by an amount given by shift input 22. The sign bits 32 and 34 of the two inputs 18 and 22, respectively, are exclusively-OR'd separately by exclusive-OR device 36 to provide the correct sign 38 for shift multiplication output 24.

FIG. 3 illustrates a prior art FIR filter design 110 using shift-matrices 30 such as those of FIG. 2. As in the conventional FIR filter of FIG. 1, an input signal 11 is converted by A/D converter 12 into a sampled digital signal 13. The digital signal 13 is latched by a series of latches 14(i). Taps 16(i) provide successive samples 18(i) of digital signal 13 to each successive shift-matrix 30(i). The applied tap weight $w_i$ is converted by logarithmically rounding to the nearest power of two ($w'_i$) by the weight converter block 21 of FIG. 4 and is stored in registers 22(i). Each register 22(i) then provides the input for a respective shift-matrix 30(i). As before, an adder array (accumulator) 26 computes the sum 28 of the outputs 24 of the shift-matrices 30.

Shift-matrix implementations of FIR filters suffer from the quantization (or round-off) errors discussed above. For small tap weights that approach zero, filter precision approaches that of the input signal word. For larger tap weights, filter precision approaches the round-off precision of the tap weights themselves. The resulting quantization error therefore increases with increasing tap weight values.

U.S. Pat. No. 4,691,293 to Conboy discloses an architecture for a multiplication-free FIR filter, as discussed above. The disclosed power-of-two shifting approach increases the speed and reduces the cost of FIR filters. However, as discussed, the architecture uses imprecise tap weight values and limits the precision of the filter output.

U.S. Pat. No. 4,782,458 to Bhattacharya et al. discloses another architecture for a power-of-two FIR filter having no multipliers. Again, multiplication is provided by a shifter that simplifies multiplication operation but limits the precision of the filter.

U.S. Pat. No. 4,805,129 to David discloses two-dimensional FIR filter arrangements. Filtration of digital signal samples is accomplished by multiplying in an array the signal words against weighting coefficients, and then summing the products.

U.S. Pat. No. 4,809,209 to White discloses a hybrid charge-transfer device filter apparatus, suitable as a sampled-data analog filter that uses only a few of the coefficient multipliers of a typical analog FIR filter.

U.S. Pat. No. 4,811,259 to Costas discloses a limited-shift signal processing system. The disclosed apparatus reduces the number of shift-matrices used in each tap multiplier.

Current methods of FIR filtering and current designs for FIR filters do not provide a simple and accurate means for digital signal processing. Using complex multiplier technology provides accurate performance, at the expense of complicated designs, increased fabrication costs and decreased frequency response. Using relatively simple shift-matrix multipliers boosts frequency response and decreases design and fabrication costs at the expense of precision. What is needed is an improved method and apparatus for FIR filtering. An improved technique for FIR filtering should provide a simple, inexpensive and accurate FIR filter. The improved apparatus and method should provide a flexible system, easily implemented with conventional devices and fabrication techniques. The improved FIR filter should provide accurate filter outputs without sacrificing filter frequency response and performance.

DISCLOSURE OF INVENTION

In accordance with the present invention, a reduced quantization error FIR filter comprises a weight conversion means (23), a signal encoding means (40), a multiplication means (30(i)), a quantization error correction means (220) and an accumulation means (26). The present invention operates on a sampled analog signal (11) that has been converted to a sequence of digital signal samples (13). The present invention employs a weight signal W comprising a sequence of weight values $W_i$. The weight conversion means (23) converts the weight signal W into a series of logarithmically-encoded weights $W'_i$ (base-2) and into a series of weight error values $\Delta W_i$, comprising the difference between each weight and its logarithmically-encoded counterpart. The signal encoding means (40) converts the sequence of digital signal samples (13) into a sequence of logarithmically-encoded digital signal samples (42).

The multiplication means (30(i)) multiplies each digital signal sample with a logarithmically-encoded weight $W'_i$ and provides the product to the accumulation means (26). The quantization error correction means (220) multiplies respective logarithmically-encoded digital signal samples with each weight error value $\Delta W_i$. The results from the quantization error correction means are also summed by the accumulation means (26) into a final quantization-corrected filter result (28).

The methods and apparatus given by the present invention provide a simple and easily-implemented means for correcting quantization errors in shift-matrix FIR filters. The present invention, by employing shift-matrix multipliers in both the main FIR multiplier (10) and in its quantization error correction means (220), provides a high-speed FIR filter (210) that provides more accurate results than current FIR filters, without sacrificing operation speed or frequency response. The relatively inexpensive components used by the present invention provide a cost-effective method for upgrading present FIR filters, and for designing powerful, fast and inexpensive FIR filters. These and other features and advantages of the present invention are apparent from the description below with reference to the following drawings.

BRIEF DESCRIPTION OF THE DRAWINGS

FIG. 1 is a block diagram illustrating an FIR filter of the prior art.

FIG. 2 shows a shift-matrix circuit block of the prior art.

DESCRIPTION OF THE PREFERRED EMBODIMENTS

Figure 3:
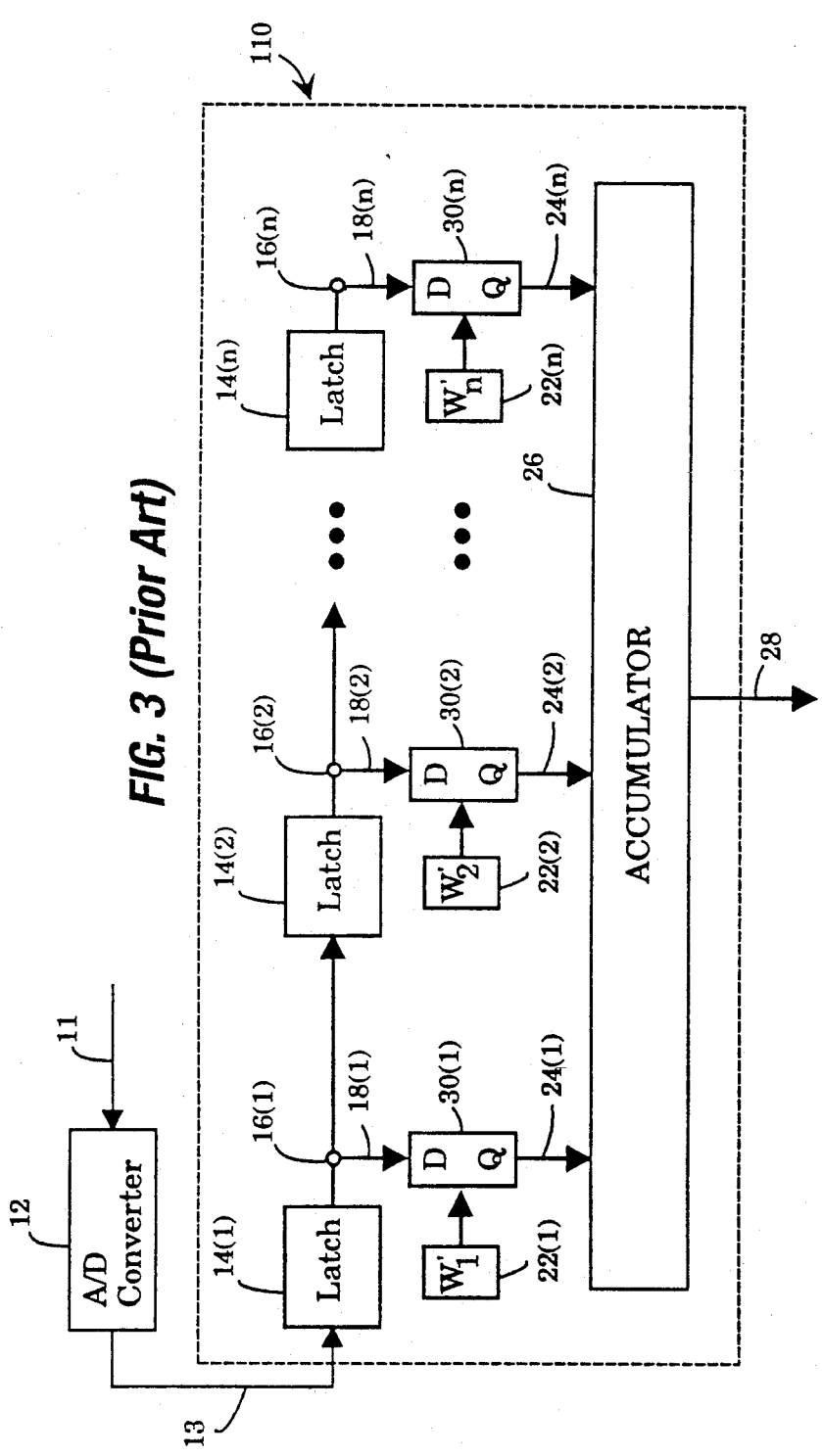
FIG. 3 shows a block diagram of an FIR filter of the prior art incorporating shift-matrix circuits.
Figure 5:
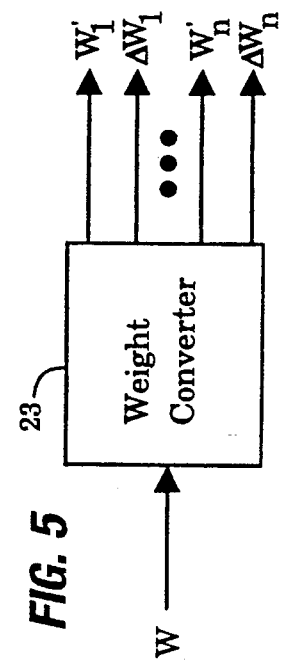
FIG. 5 shows a weight converter block in accordance with the present invention.
Figure 4:
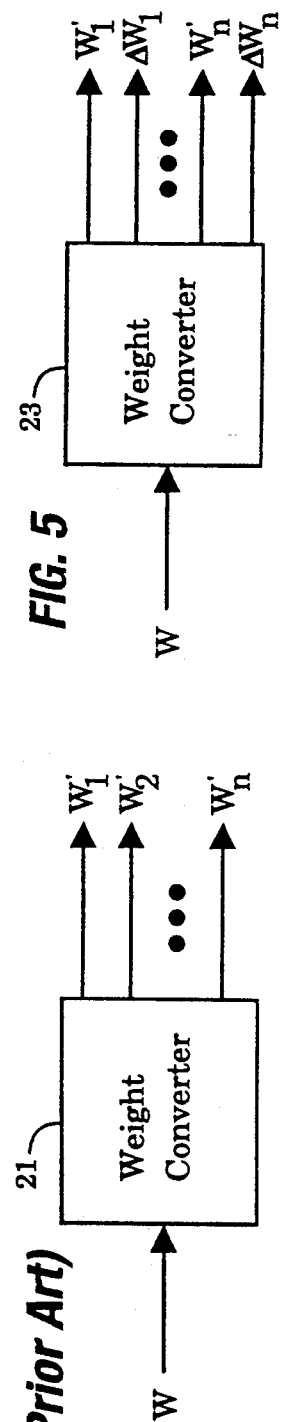
FIG. 4 shows a weight converter block of the prior art.
Figure 6:
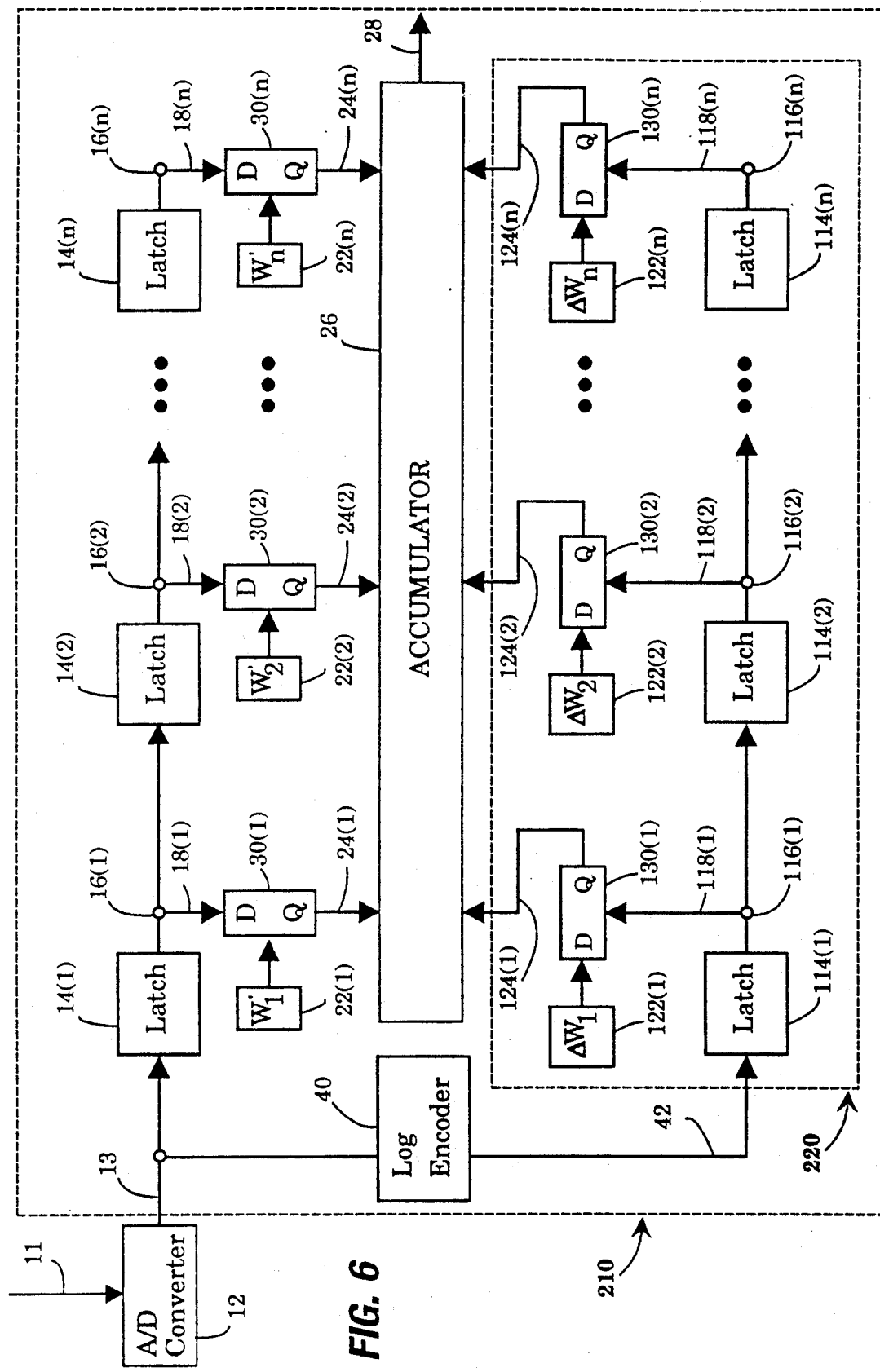
FIG. 6 is a block diagram illustrating the architecture of the present invention.

In accordance with the present invention, a reduced quantization error FIR filter 210 is shown in FIG. 6. The upper portion of the present invention comprises essentially the same circuitry as shown in FIG. 3. An input sampled analog signal 11 is converted by A/D converter 12 into a digital sampled signal 13 consisting of a time-series sequence of digital signal samples. As shown in FIG. 5, a weight converter block 23 converts a weight signal W consisting of a sequence of filter weights $W_i$ to a (base-two) logarithmically-encoded sequence of weights $W'_i$ (i.e., rounded to a power of two) and a sequence of weight error values $\Delta W_i = W_i - W'_i$. The logarithmic weights $W'_i$ are stored in weight registers 22(i), while the weight error values are stored in weight error registers 122(i) discussed further below.

The series of digital signal samples 13 is stored sequentially in a cascaded series of latches 14(i). As before, each tap 16(i) transfers one digital sample 18(i) to a shift-matrix multiplier 30(i), where the digital signal value is shifted according to the logarithmically-encoded weight $W'_i$ stored in corresponding weight register 22(i). The products 24(i) of all shift-matrix multipliers 30(i) are added in accumulator 26.

The present invention also includes a signal encoding means 40 that converts the incoming sequence of digital signal samples 13 to their logarithmic (base-two) values 42. A simple design for the signal encoding means comprises a single ROM or RAM circuit; the input signal provides an address to a memory area holding the $\log_2$ value of the input. The resulting logarithmic values 42 are transferred to a quantization error correction means 220. The quantization error correction means 220 comprises a series of secondary latches 114(i), taps 116(i), shift-matrix multipliers 130(i) and weight error registers 122(i). Each of these sets of components finds its counterpart in the main portion of the FIR filter discussed above. The logarithmically-encoded digital signal samples are stored sequentially in secondary latches 114(i). Taps 116(i) transfer a logarithmically-encoded signal sample 118(i) to shift-matrix multiplier 130(i). The construction and operational timing of the present invention is such that when a digital signal sample 18(i) is being transferred by tap 16(i), its respective logarithmic value 118(i) is being transferred by respective tap 116(i). In quantization error correction means 220, the logarithmically-encoded signal sample 118(i) provides the shifting value for shift-matrix multiplier 130(i) for shifting the weight error value $\Delta W_i$ provided by weight error register 122(i). The results 124(i) of this shifting operation are also provided to accumulator 26, which sums all the multiplications per each shifting step and provides the result as an FIR filter output 28.

Let $x_i$ represent a digital signal value, and $x'_i$ represent the logarithmically-encoded digital signal value. Conventional FIR filters employing shift-matrix multipliers provide an output y' given by:

$$y' = \sum_{i=1}^{n} w'_i x_i \qquad \text{EQN. (2)}$$

that provides a quantization error $E_{1i}$ (as compared with the general FIR filter equation given by EQN. 1 above) for each summand given by:

$$E_{1i} = (w_i - w'_i) x_i \qquad \text{EQN. (3)}$$

In contrast, the present invention provides an output y" given by: that provides a reduced quantization error for each summand given by:

$$y'' = \sum_{i=1}^{n} (w'_i x_1 + \Delta w_i x'_i) \qquad \text{EQN. (4)}$$

$$E_{2i} = (w_i - w'_i)(x_i - x'_i) \qquad \text{EQN. (5)}$$

The absolute mean quantization errors of the prior art $E_{1i}$ and the reduced quantization errors $E_{2i}$ of the present invention can be calculated as follows. Let $E[\ ]$ denote the expectation operator, and assume that w and x are uniformly distributed random variables. For the prior art, $$\begin{aligned} E[|E_{1i}|] &= E[|(w_i - w'_i)x_i|] \\ &= E[|(w_i - w'_i)|]E[|x_i|] \\ &= \tfrac{1}{2}E[|(w_i - w'_i)|]. \end{aligned} \qquad (6)$$

For the present invention, $$\begin{aligned} E[|E_{2i}|] &= E[|(w_i - w'_i)(x_i - x'_i)|] \\ &= E[|(w_i - w'_i)|]E[|(x_i - x'_i)|]. \end{aligned} \qquad (7)$$

Assuming that the $x_i$'s and the $w_i$'s have n bits of resolution:

$$\begin{aligned} E[|(w_i - w'_i)|] &= E[|(x_i - x'_i)|] \\ &= \sum_{i=0}^{n-1} \frac{(2^{-i} - 2^{-i-1})^2}{4} + \frac{2^{-2n}}{4}. \end{aligned} \qquad (8)$$

In the case where n=8, one obtains:

$$E[|E_{1i}|] = 0.04167$$

$$E[|E_{2i}|] = 0.00694. \qquad (9)$$

Comparing these expectations of $E_{1i}$ and $E_{2i}$ illustrates the effectiveness of the present invention. Given a typical range of sample inputs, the present invention reduces the summand quantization errors by approximately a factor of 6, without reducing the device's speed of operation.

While the present invention has been described with reference to preferred embodiments, those skilled in the art will recognize that various modifications may be provided. For example, any number of latch, tap and multiplier units can be employed to create a FIR filter having a desired precision. In addition, the correction scheme provided by the present invention is not limited to FIR filters employing only one shift-matrix per multiplier. Furthermore, practice of the present invention does not require correcting every logarithmic weight employed. For instance, an adaptive implementation could provide correction for only those taps whose shift multiplications yield the greatest errors. A number of equivalent devices can be used to implement the present invention. These and other variations upon and modifications to the described embodiments are provided for by the present invention, the scope of which is limited only by the following claims.

What is claimed is:

1. A finite impulse response filter for filtering an input signal, said filter comprising:
   coupled to said input signal, a sampling means for sampling said input signal to produce a sampled digitized signal comprising a time-series plurality of digital signal samples;
   a weight signal comprising a plurality of weights;
   coupled to said weight signal, a weight conversion means for converting said weight signal into a corresponding logarithmic weight signal comprising a plurality of logarithmically-encoded weights;
   coupled to said sampled digitized signal, an input signal encoding means for encoding said sampled digitized signal into a corresponding logarithmic sampled digital signal comprising a time-series plurality of logarithmically-encoded digital signal samples;
   a multiplication means coupled to said weight conversion means for multiplying each of said digital signal samples with a corresponding one of said logarithmically-encoded weights;
   a quantization error correction means coupled to said input signal encoding means and to said weight conversion means for multiplying each of said logarithmically-encoded digital signal samples with a corresponding weight error; and
   an accumulation means coupled to said multiplication means and to said quantization error correction means for producing a filtered signal.

2. The apparatus as recited in claim 1 wherein said input signal is an analog signal.

3. The apparatus as recited in claim 1 wherein each of said weight errors comprises a difference between one of said weights and a corresponding one of said logarithmically-encoded weights.

4. The apparatus as recited in claim 1 wherein said weight conversion means further comprises:
   a first weight encoder means for converting each weight of said plurality of weights into one of said logarithmically-encoded weights;
   a weight register means for storing said logarithmically-encoded weights;
   a second weight encoder means for calculating each of said weight errors; and
   a weight error register means for storing said weight errors.

5. The apparatus as recited in claim 1 wherein said multiplication means further comprises:
   a plurality of primary delay latches for storing said digital signal samples in a consecutive time sequence; and
   a plurality of primary shifting means correspondingly coupled to said primary delay latches for multiplying each of said stored digital signal samples with one of said logarithmically-encoded weights.

6. The apparatus as recited in claim 5 wherein each said primary shifting means comprises a binary shift-matrix device for binary shifting said digital signal sample by said logarithmically-encoded weight.

7. The apparatus as recited in claim 1 wherein said quantization error correction means further comprises:
   a plurality of secondary delay latches for storing said logarithmically-encoded digital signal samples in a consecutive time sequence; and
   a plurality of secondary shifting means correspondingly coupled to said secondary delay latches for multiplying each of said weight errors with one of said stored logarithmically-encoded digital signal samples.

8. The apparatus as recited in claim 7 wherein each said secondary shifting means comprises a binary shift-matrix device for binary shifting said weight error by said logarithmically-encoded digital signal sample.

9. A method for filtering an input signal, said method comprising:
   (a) sampling said input signal into a time-series plurality of digitized signal samples;
   (b) providing a digitized weight signal comprising a plurality of weights;
   (c) converting said digitized weight signal into a corresponding logarithmic weight signal comprising a series of logarithmically-encoded weights;
   (d) encoding said sampled digitized signal into a corresponding logarithmic sampled digitized signal comprising a time-series plurality of logarithmically-encoded digital signal samples;
   (e) respectively multiplying said plurality of digitized signal samples with said plurality of logarithmically-encoded weights;
   (f) respectively multiplying said plurality of logarithmically-encoded digital signal samples with a plurality of weight errors; and
   (g) summing the products of said multiplication steps (e) and (f) for producing a digitized filtered signal.

10. A method for filtering an input signal as recited in claim 9 wherein said input signal is an analog signal.

11. A method for filtering an input signal as recited in claim 9 wherein said plurality of weight errors comprise respective differences between said plurality of weights and said plurality of logarithmically-encoded weights.

12. A method for filtering an input signal as recited in claim 9 wherein said step of converting said digitized weight signal further comprises:
   (a) converting each weight of said plurality of weights into one of said logarithmically-encoded weights; and
   (b) calculating each of said weight errors as a difference between each of said weights and a corresponding one of said logarithmically-encoded weights.

13. A method for filtering an input signal as recited in claim 9 wherein said multiplication step (e) further comprises:
   (a) storing said digitized signal samples in a consecutive time sequence; and
   (b) multiplying each of said stored digitized signal samples with one of said logarithmically-encoded weights.

14. A method as recited in claim 13 wherein said substep of multiplying each of said stored digitized signal samples comprises binary shifting said stored signal sample by said logarithmically-encoded weight.

15. A method for filtering an input signal as recited in claim 9 wherein said multiplication step (f) further comprises:
   (a) storing said logarithmically-encoded digital signal samples in a consecutive time sequence; and
   (b) multiplying each of said stored logarithmically-encoded digital signal samples with one of said weight errors.

16. A method as recited in claim 15 wherein said substep of multiplying each of said stored logarithmically-encoded digital signal samples comprises binary shifting each said stored logarithmically-encoded digital signal sample by said weight error.

* * * * *